United States Patent
Marquardt et al.

(10) Patent No.: US 11,773,485 B2
(45) Date of Patent: *Oct. 3, 2023

(54) BOTTOM FED SUBLIMATION BED FOR HIGH SATURATION EFFICIENCY IN SEMICONDUCTOR APPLICATIONS

(71) Applicant: Applied Materials, Inc., Santa Clara, CA (US)

(72) Inventors: David Marquardt, Scottsdale, AZ (US); Carl White, Gilbert, AZ (US); Mohith Verghese, Phoenix, AZ (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/095,053

(22) Filed: Jan. 10, 2023

(65) Prior Publication Data

US 2023/0160064 A1    May 25, 2023

Related U.S. Application Data

(63) Continuation of application No. 17/367,284, filed on Jul. 2, 2021, now Pat. No. 11,584,990.

(51) Int. Cl.
  *C23C 16/40* (2006.01)
  *C23C 16/448* (2006.01)
  *C23C 16/44* (2006.01)

(52) U.S. Cl.
  CPC ...... *C23C 16/4481* (2013.01); *C23C 16/4402* (2013.01)

(58) Field of Classification Search
  CPC .......... C23C 16/4402; C23C 16/45544; C23C 16/405; C23C 16/45578; C23C 16/448; C23C 16/4481; H01L 21/67017; B01D 45/08; B01D 50/002

USPC ................ 118/723 VE, 726; 156/345.29
See application file for complete search history.

(56) References Cited

U.S. PATENT DOCUMENTS

| | | |
|---|---|---|
| 5,057,285 A | 10/1991 | Belt et al. |
| 5,377,429 A | 1/1995 | Sandhu et al. |
| 6,527,865 B1 | 3/2003 | Sajoto et al. |
| 6,598,618 B1 | 7/2003 | Shay |
| 7,122,085 B2 | 10/2006 | Shero et al. |
| 7,601,225 B2 | 10/2009 | Tuominen et al. |

(Continued)

FOREIGN PATENT DOCUMENTS

| | | |
|---|---|---|
| EP | 2247769 B1 | 9/2011 |
| EP | 3450588 A1 | 3/2019 |

(Continued)

OTHER PUBLICATIONS

PCT International Search Report and Written Opinion in PCT/US2022/035758 dated Oct. 28, 2022, 12 pages.

*Primary Examiner* — Rudy Zervigon
(74) *Attorney, Agent, or Firm* — Servilla Whitney LLC

(57) ABSTRACT

Bottom-fed ampoules for a semiconductor manufacturing precursors and methods of use are described. The ampoules comprise an outer cylindrical wall and an inner cylindrical wall defining a flow channel in between and a bottom wall having a top surface with a plurality of concentric elongate walls, each wall comprising an opening offset from the opening in adjacent walls defining a gas exchange zone through which a carrier gas flows in contact with the precursor.

16 Claims, 3 Drawing Sheets

(56) References Cited

U.S. PATENT DOCUMENTS

Figure 1:
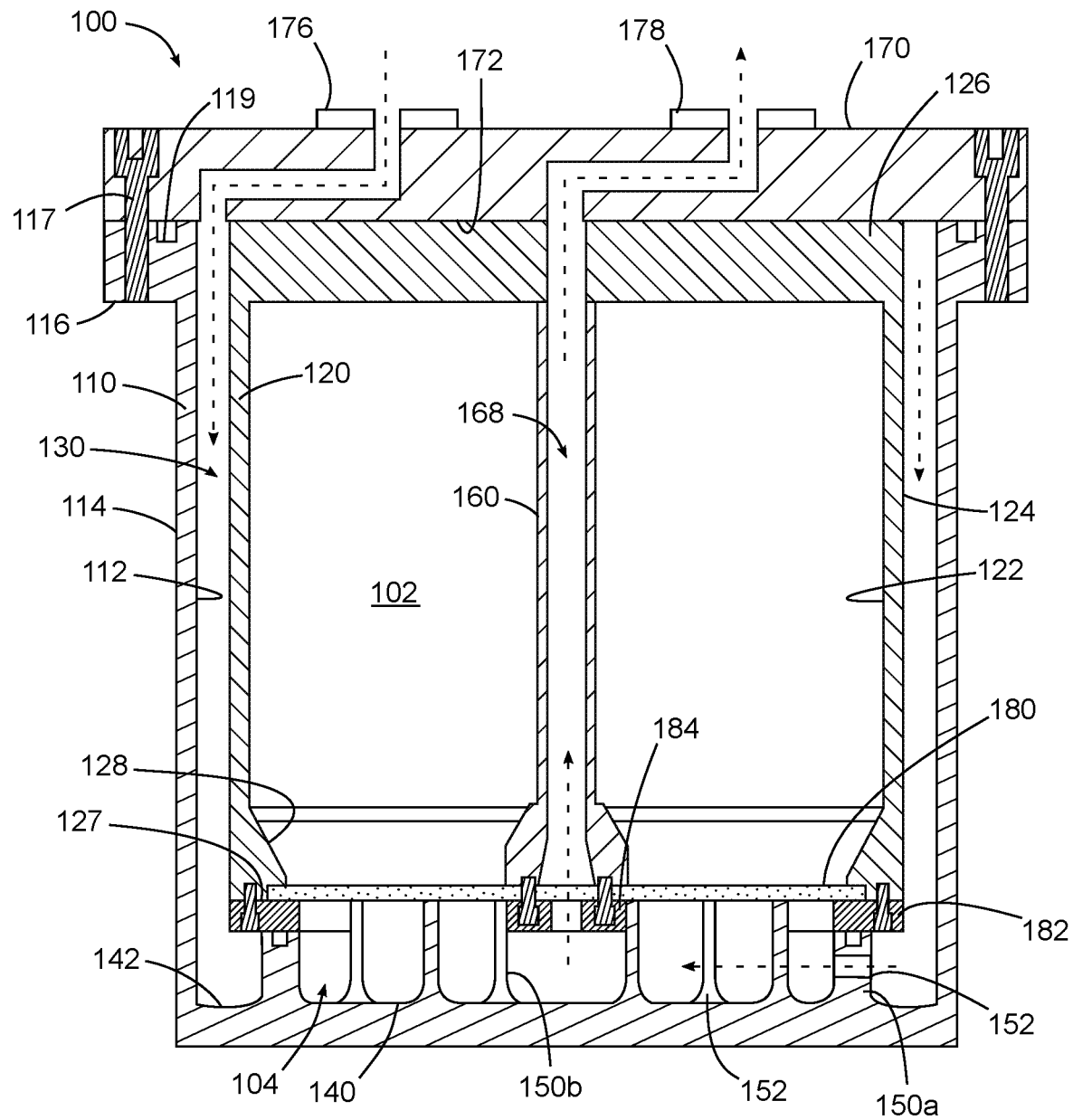

| | | |
|---|---|---|
| 7,971,861 B2 | 7/2011 | Soininen et al. |
| 8,137,462 B2 | 3/2012 | Fondurulia et al. |
| 9,034,105 B2 | 5/2015 | Chaubey et al. |
| 10,385,452 B2 | 8/2019 | Hendrix et al. |
| 10,392,700 B2 | 8/2019 | Baum et al. |
| 10,465,286 B2 | 11/2019 | Gregg et al. |
| 10,876,205 B2 | 12/2020 | Verghese et al. |
| 10,895,010 B2 | 1/2021 | Cleary et al. |
| 11,035,038 B2 | 6/2021 | Baum et al. |
| 11,136,169 B2 | 10/2021 | Chatterton et al. |
| 2005/0066893 A1 | 3/2005 | Soininen |
| 2006/0216419 A1 | 9/2006 | Shero et al. |
| 2006/0219168 A1* | 10/2006 | Brcka ................ C23C 16/4481 118/726 |
| 2007/0089674 A1 | 4/2007 | Aitchison et al. |
| 2008/0191153 A1 | 8/2008 | Marganski et al. |
| 2014/0026977 A1 | 1/2014 | Kimmerle et al. |
| 2014/0029374 A1 | 1/2014 | Kimmerle et al. |
| 2019/0032206 A1 | 1/2019 | Hodges et al. |
| 2019/0055649 A1* | 2/2019 | Lee ................... C23C 16/45544 |
| 2020/0056283 A1 | 2/2020 | Shero et al. |
| 2022/0064786 A1* | 3/2022 | Itsuki ................... C23C 16/405 |

FOREIGN PATENT DOCUMENTS

| | | |
|---|---|---|
| JP | 2014009392 A | 1/2014 |
| KR | 20140099160 A | 8/2014 |
| WO | 2018234285 A1 | 12/2018 |

* cited by examiner

BOTTOM FED SUBLIMATION BED FOR HIGH SATURATION EFFICIENCY IN SEMICONDUCTOR APPLICATIONS

CROSS-REFERENCE TO RELATED APPLICATIONS

This application is a continuation of U.S. patent application Ser. No. 17/367,284, filed Jul. 2, 2021, the entire disclosure of which is hereby incorporated by reference herein.

TECHNICAL FIELD

The present disclosure relates generally to ampoules and methods for using ampoules for semiconductor manufacturing precursors. In particular, the disclosure relates to ampoules and methods to provide bottom fed sublimation bed and tortuous flow path for low vapor pressure precursors.

BACKGROUND

The semiconductor industry is using an increasing variety of chemistries for chemical vapor deposition (CVD) and atomic layer deposition (ALD) processes that come in liquid or solid form. The precursor is typically inside a closed vessel or ampoule with a single inlet and a single outlet.

Solid precursors with a low vapor pressure frequently use a carrier gas to carry the vapor out of the ampoule to the process reactor. For these types of processes there are two types of ampoules typically used: a bubbler where the inlet carrier gas goes into a tube that is submerged into the precursor; and a cross-flow ampoule where the carrier gas sweeps headspace in the ampoule from the top. Often, there is only a very short flow path for the carrier gas. The short flow path from the inlet to the outlet of the vessel does not allow adequate residence time within the vessel to allow the carrier gas to become fully saturated with vaporized or sublimed precursor. Some existing ampoule designs do not evenly distribute the carrier gas across the entire surface of the precursor. Some existing ampoules designs do not provide adequate heating of the precursor within the entire vessel. Many other solid source ampoules do not provide a means for keeping precursor dust from traveling downstream where it hampers control valve performance or creates on-wafer particle issues.

Conventional top-fed sublimation architectures include an ampoule or cannister partially filled with solid precursor, which rests on the bottom of the ampoule. As the ampoule is heated and carrier gas is introduced into the head space of the ampoule, sublimation occurs between the top surface of the solid precursor and the carrier gas within the head space. In an ideal scenario, the carrier gas flowing through the ampoule becomes saturated with the precursor. As the head space of the ampoule increases, resulting in varying concentrations of saturated carrier gas, an inconsistent dose of precursor-carrier gas is supplied. As such, carrier gas saturation is not maintained due to inefficiencies in the ampoule and solid precursor depletion.

There is a need in the art for ampoules, methods of making ampoules and/or methods of using ampoules with one or more of an increased flow path, increased surface area for sublimation and for consistent concentrations of saturated carrier gas.

SUMMARY

One or more embodiments are directed to an ampoule for a semiconductor precursor material having a torturous path for increased dwell time in a bottom-fed configuration. The ampoule comprises an outer cylindrical wall, an inner cylindrical wall, a bottom wall, an outlet conduit and a lid.

The outer cylindrical wall has an inside surface and an outside surface. The inner cylindrical wall has an inside surface and an outside surface, the inner cylindrical wall having an outer diameter less than an inner diameter of the outer cylindrical wall to form an inlet channel between the inner cylindrical wall and the outer cylindrical wall. The bottom wall has a top surface with a plurality of concentric elongate walls, each wall comprising an opening offset from the opening in adjacent walls. The outlet conduit has an inside surface and an outside surface and an outer diameter less than the inner diameter of the inner cylindrical wall to form a cavity and an inner diameter defining an outlet channel. The lid has a bottom surface in contact with one or more of the outer cylindrical wall, the inner cylindrical wall or the outlet conduit to enclose the inlet channel and the cavity, the lid having an inlet opening in fluid communication with the inlet channel and an outlet opening in fluid communication with the outlet conduit.

In some embodiments, the ampoule further comprises a filter media in contact with a top surface of each of the concentric elongate walls. In some embodiments, a gas exchange zone is formed between the filter media, the plurality of concentric elongate walls and the bottom wall, the exchange zone forming a torturous path for a gas to flow from the inlet channel to the outlet conduit. In some embodiments, a solid precursor rests above the filter media, such that depletion of solid precursor does not cause concentration variations within the gas exchange zone. In some embodiments, the filter media is secured between an outer retention ring and a bottom surface of the inner cylindrical wall, and in further embodiments, the filter media is secured between an outer retention ring and a bottom surface of the inner cylindrical wall.

In some embodiments, the outer retention ring is fastened to the bottom surface of the inner cylindrical wall by a plurality of fasteners. In some embodiments, the filter media is secured between an inner retention ring and a bottom surface of the outlet conduit.

In some embodiments, a bottom end of the inner cylindrical wall includes an inner sloped flange. In some embodiments, the outer cylindrical wall is integral with the bottom wall. In some embodiments, the outer cylindrical wall is removably secured to the bottom wall by a plurality of fasteners.

In some embodiments, the outlet conduit is integral with a bottom surface of the lid. In some embodiments, the inner cylindrical wall is integral with the bottom surface of the lid.

In some embodiments, the ampoule further comprises a top wall integral with a top surface of the inner cylindrical wall, the top wall having a top surface in contact with the bottom surface of the lid.

In some embodiments, a top surface of the outer cylindrical wall includes a groove having an O-ring.

In some embodiments, a flange extends outward from a top surface of the outer cylindrical wall, the flange in contact with the bottom surface of the lid.

Further embodiments comprise a bottom wall having a top surface with a plurality of concentric elongate walls, each wall comprising an opening offset from the opening in adjacent walls, the bottom wall having a diameter greater than the inner diameter of the outer cylindrical wall, the outer cylindrical wall removably secured to the bottom wall by a plurality of fasteners.

Some embodiments are directed to a method of saturating a carrier gas comprising the steps of introducing a carrier into an ampoule by an inlet channel; pushing the carrier gas into a gas exchange zone, the gas exchange zone formed between a plurality of concentric elongate walls protruding from a bottom wall and a filter media positioned over a plurality of concentric walls; saturating the carrier gas with vaporized precursor within the gas exchange zone by passing the carrier gas through an inlet of an outermost elongate wall of the plurality of elongate walls to an outlet of an innermost elongate wall of the plurality of elongate walls; and ejecting the carrier gas through an outlet conduit.

In some embodiments, the method further comprises heating solid precursor solid precursor such vaporized solid precursor passes through the filter media.

In some embodiments, the exchange zone forms a torturous path for the carrier gas to flow from the inlet channel to the outlet conduit.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 illustrates a schematic view of an ampoule having a torturous flow configuration in accordance with an embodiment of the present disclosure;

FIG. 2 illustrates a cross-sectional view of an ampoule having a torturous flow configuration in accordance with an embodiment of the present disclosure;

FIG. 3 illustrates a detailed cross-sectional view of illustrating a bottom wall removably fastened to an outermost wall of the ampoule; and, FIG. 4 illustrates a bottom view of an ampoule having a torturous flow configuration in accordance with an embodiment of the present disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label. The cross-hatch shading of the components in the figures are intended to aid in visualization of different parts and do not necessarily indicate different materials of construction.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

Some embodiments of the disclosure advantageously provide a long flow path for a carrier gas from ampoule inlet to outlet for the delivery of low vapor pressure precursors, e.g., liquid and/or solid source precursor. Low vapor pressure precursors are understood to refer to materials that do not readily vaporize under atmospheric conditions. Low vapor pressure precursors typically have a vapor pressure of less than 10 Torr, and more typically less than 1 Torr. In some applications, a carrier gas is used to deliver low vapor pressure material from an ampoule to a reactor. Low vapor pressure materials typically require heat to increase the vapor pressure. A non-limiting list of exemplary precursors includes $ZrCl_4$, $Y(EtCP)_3$, $HfCl_4$, $WCl_5$, $MoCl_5$, $In(CH_3)_3$, and liquid $SiI_4$, $Mg(Cp)_2$.

A flow path having a long and torturous distance allows the carrier gas adequate residence time to become partially to nearly to fully saturated with vaporized and/or sublimed and/or entrained precursor. As used herein, the term "torturous path" means a flow path that has multiple branches, curves, angles, turns, etc., that prevent a straight path for the flow. In some embodiments, the torturous path increases the residence time of the gas within the manifold to increase concentration uniformity. Reference herein to "saturated" allows for varying degrees of saturation.

Some embodiments of the disclosure advantageously provide bottom-fed ampoule configurations. Some embodiments advantageously provide ampoules in which depletion of the solid precursor does not affect the concentration of the saturated carrier gas.

Some embodiments provide apparatus and methods for heating low vapor pressure precursors in large volume ampoules, including ways to provide effective uniform heating of the precursors. Some specific embodiments advantageously retain low vapor pressure precursors, including solid precursor dust, within a cavity of the vessel, not allowing it to migrate upstream or downstream to control valves by means of filter media. Some embodiments advantageously control uneven depletion of the precursor. Some embodiments advantageously provide even distribution of the carrier gas along the entire surface of a precursor bed in a bottom-fed configuration. Embodiments herein provide improved doses of the precursor.

In some embodiments, the ampoules comprise a bottom wall having a plurality of elongate walls defining a labyrinth such that the flow path is tortuous. Advantageously, one or more embodiments provide a flow path whose distance can be five to ten times longer than distances found with common ampoules, in particular solid source sublimation vessels. The increased flow path allows for a longer dwell time of carrier gas and vaporized precursor chemistry to mix within the ampoule.

Ampoules disclosed herein comprise a container defining a cavity configured to hold a precursor; an inlet port and an outlet port, both in fluid communication with the cavity; and a bottom wall having a serpentine base. The serpentine base comprises a plurality of elongate walls arranged to define torturous flow channels (also referred to a "serpentine path"), each of the elongate walls comprising a plurality of openings. A flow path is defined by the flow channels and the plurality of openings, through which a carrier gas flows in contact with vaporized or sublimed precursor.

Ampoules disclosed herein are in a bottom-fed configuration such that the precursor is separated from a lower chamber by a sublimation bed defined by a filter media. In such a configuration, the gas exchange zone below the filter media maintains a constant volume as precursor resting above the filter media is depleted as carrier gas passes across the filter media. The gas exchange zone is configured to increase the dwell time of carrier gas and vaporized precursor chemistry to mix within the ampoule.

Carrier gas passes across the sublimation bed in the gas exchange zone where the precursor chemistry and the carrier gas mix and flow to form a saturated gas mixture of precursor and carrier gas. Carrier gas is streamed directly across the filter media in order to saturate the carrier gas with precursor particles. In some embodiments, the carrier gas flows through a torturous path positioned within the gas exchange zone. The torturous path and the gas exchange zone is configured to increase the duration in which the carrier gas is interacting with precursor chemistry to promote increased saturation of the carrier gas with vaporized precursor.

Generally, the flow paths provided herein force the carrier gas to flow around a series of elongate walls, which in one or more particular embodiments are nested concentric tubes having one or more plurality of openings passageways, which define flow channels. The gas flow changes direction from flow channel to flow channel until the last flow channel in communication with the outlet port is reached. This change of direction also enhances mixing of the vaporized and/or sublimed precursor with the carrier gas. Plurality of openings are offset from one another allow the carrier gas to flow through into the next flow channel creating a torturous path. As the carrier gas passes from an inlet opening of an outermost elongate wall through the gas exchange zone, through an outlet opening of an innermost elongate wall, pure carrier gas becomes partially saturated and then fully saturated with precursor chemistry before exiting through the outlet of the ampoule.

Figure 4:
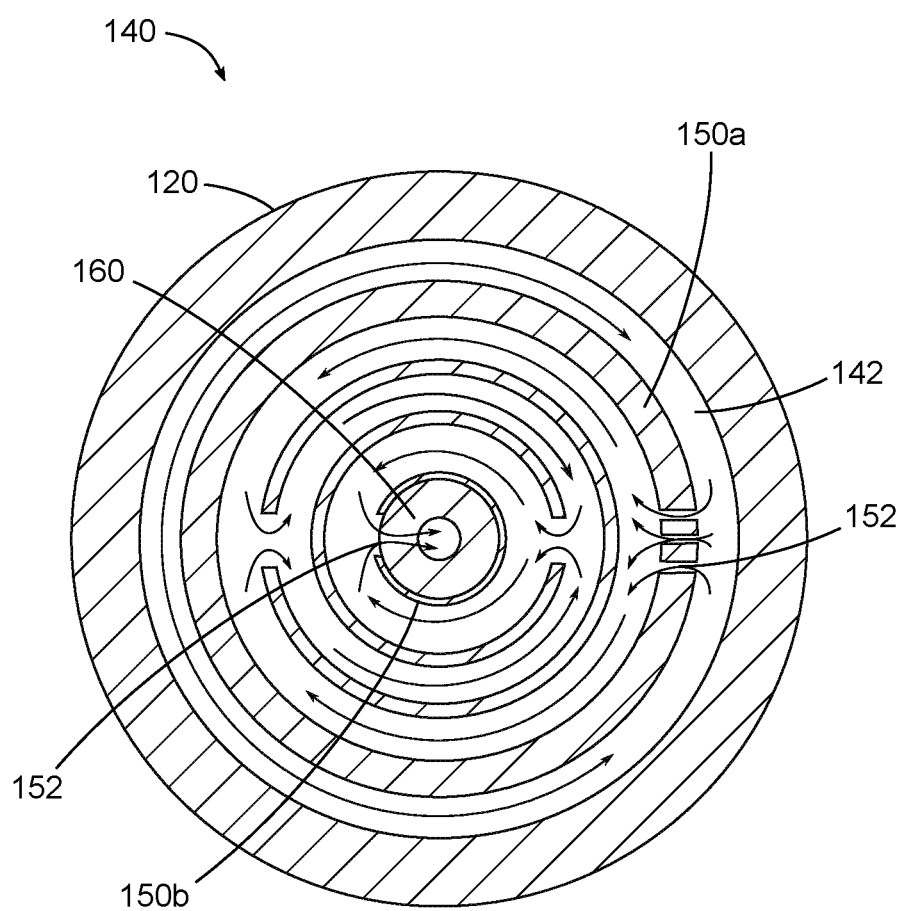

Reference herein to gas flow includes the carrier gas alone or in combination with entrained and/or vaporized and/or sublimed precursor. The flow paths of the gas exchange zones described herein, for example, in FIGS. 1, 2 and 4 comprise a series of elongate walls, tubular or otherwise, with plurality of openings offset from one another configured to define flow channels therebetween will result in a desired flow path. In some embodiments, as shown in FIG. 4, each of the elongate walls comprise one opening offset from an opening of an adjacent elongate wall configured to define flow channels therebetween will result in a desired flow path. In some embodiments, the plurality of openings are off-set to ensure no flow channels are bypassed. Such a configurations are referred throughout the disclosure as "serpentine path" or "torturous path" interchangeably.

Figure 2:
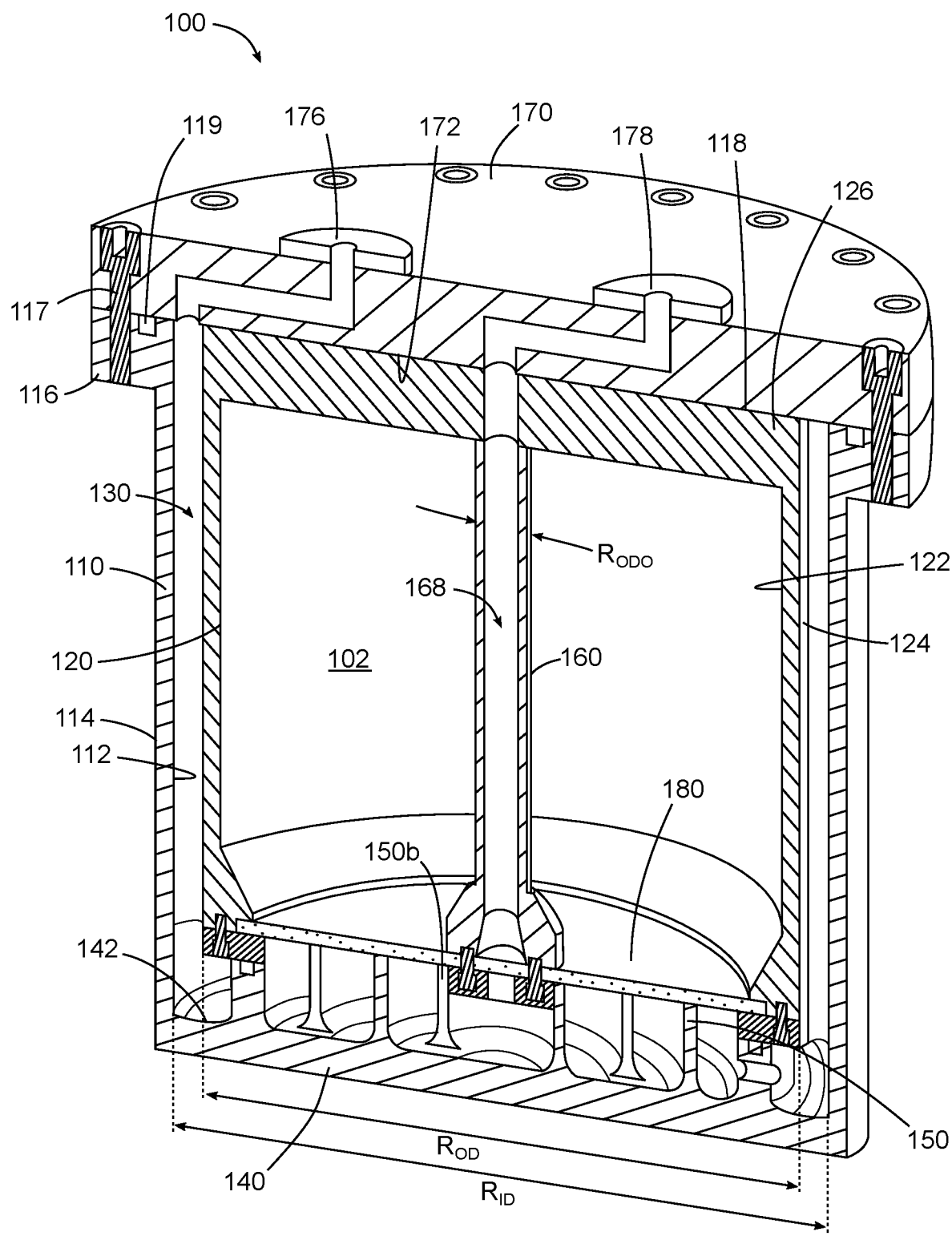
Figure 3:
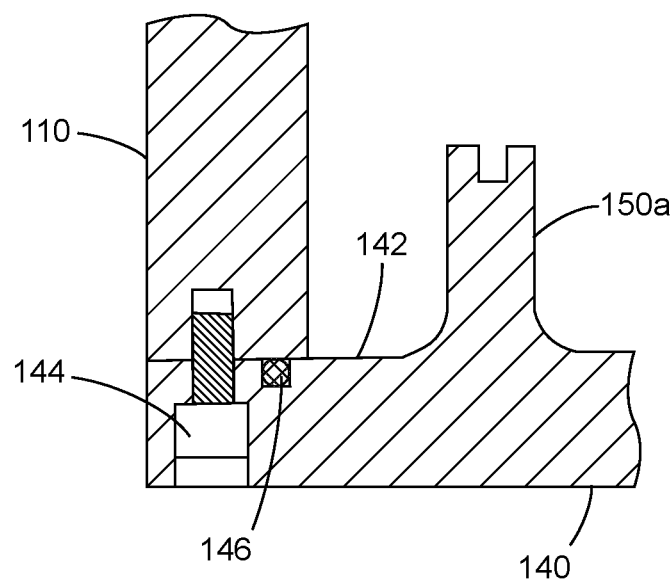

FIGS. 1 through 3 illustrate schematic representations of an ampoule for a semiconductor precursor material having one or more components separable or integral with one another, with a bottom wall of the ampoule comprising a plurality of concentric elongate walls forming a torturous path. In FIG. 3. the bottom wall is a separate component from an outer cylindrical wall such that the ampoule can be filled with solid precursor, the filter media can be serviced, and the ampoule can be cleaned. FIG. 4 illustrates a top view of the bottom wall showing a torturous flow path configuration in accordance with one or more embodiments.

The ampoules described herein are suitable for use with semiconductor manufacturing raw materials, which include reagents and precursors. In the embodiments shown, the precursor is suspended above a filter media configured as a sublimation bed. The general region above the filter media is defined by a cavity for holding solid precursor. The general region below the filter media is characterized as a gas exchange zone in which saturation of the carrier gas occurs. Pure or unsaturated carrier gas first passes from an inlet channel formed between the inner cylindrical wall and the outer cylindrical wall to an opening of an outermost wall of a plurality of concentric elongate walls. The carrier gas is streamed across the filter media and through the torturous path until it passes through an opening of an outermost wall of the plurality of concentric elongate walls. The carrier gas is then expelled through an outlet conduit.

As shown in FIGS. 1 and 2, the ampoule 100 comprises an outer cylindrical wall 110 with an inside surface 112 and an outside surface 114 and an inner cylindrical wall 120 with an inside surface 122 and an outside surface 124, the inner cylindrical wall 120 having an outer diameter ROD less than an inner diameter RID of the outer cylindrical wall 110 to form an inlet channel 130 between the inner cylindrical wall 120 and the outer cylindrical wall 110. In some embodiments, the outer cylindrical wall 110 and inner cylindrical wall 120 are concentric such that gas flowing through the inlet channel 130 flows from an inlet opening 176 towards a bottom wall 140 of the ampoule 100. In some embodiments, the inlet opening 176 is integral to a lid 170 as explained in further detail below. The inlet opening 176 is in fluid communication with the inlet channel 130 and an outlet opening 178 is in fluid communication with the outlet conduit 160.

The ampoule further comprises the bottom wall 140 having a top surface 142. From the top surface 142 extend a plurality of concentric elongate walls 150, each of the concentric elongate walls 150 comprising a plurality of openings 152 offset from openings 152 of one or more adjacent walls 150 of the plurality of elongate walls 150. In some embodiments, each of the plurality of concentric elongate walls 150 comprise a plurality of openings 152. In some embodiments, each of the plurality of concentric elongate walls 150 comprise a single opening 152. As shown in FIG. 4, the openings 152 of the plurality of concentric elongate walls 150 are offset from one another allow gas to flow through into a subsequent flow channel of an adjacent concentric elongate walls 150 creating a torturous path. In some embodiments, each opening 152 of each of the plurality of concentric elongate walls 150 are offset by 180 degrees by one another.

The ampoule 100 further comprises a lid 170 having a bottom surface 172 in contact with one or more of the outer cylindrical wall 110, the inner cylindrical wall 120 or an outlet conduit 160 to enclose the inlet channel 130 and the precursor cavity 102.

In some embodiments, the bottom surface of the lid 170 is integral with the outlet conduit 160. In some embodiments, the bottom surface of the lid 170 is integral with the inner cylindrical wall 120 and the outlet conduit 160. In such configurations, the inner cylindrical wall 120 and outlet conduit 160 can also be integral with a top wall 126, thus connecting the inner cylindrical wall 120, the outlet conduit 160 and the top wall 126 with the bottom surface of the lid 170. In further embodiments, the inner cylindrical wall and the outlet conduit 160 are integral with the top wall 126 forming a manifold which can be used with conventional lids. Said manifold comprising the inner cylindrical wall 120 and the outlet conduit 160 can be removed, serviced and refilled with precursor within the precursor cavity 102 formed by the inner surface 122 of the inner cylindrical wall 120.

As previously described, in some embodiments, the outer cylindrical wall 110 is integral with the bottom wall 140. In some embodiments, as shown in FIG. 3, the outer cylindrical wall 110 is removably secured to the top surface 142 of the bottom wall 140 by a plurality of fasteners 144 such that the precursor cavity 102 can be accessible and services from the bottom. The top surface 142 of the bottom wall 140 can further include a channel 146 for an O-ring to create a fluid-tight seal between the top surface 142 of the bottom wall 140 and a bottom surface of the inner cylindrical wall 120.

In embodiments where the outer cylindrical wall 110 is a separate component from the lid 170, a flange 116 can extend outward from the outside surface 114 and from a top surface 118 of the outer cylindrical wall 110, the flange 116 in contact with the bottom surface of the lid 170. In such embodiments, the top surface 118 can further include a groove or channel 119 for an O-ring to create a fluid-tight seal between the top surface 118 the bottom surface of the lid 170. The lid 170 can be secured to the flange 116 by a plurality of fasteners 117 extending through the flange 116.

The lid 170 further includes an inlet opening 176 in fluid communication with the inlet channel 130 and an outlet opening 178 in fluid communication with the outlet conduit 160. As shown in FIG. 2, the outlet conduit 160 has an inside surface and an outside surface with the outside defining an outer diameter $R_{ODO}$ which is less than the inner diameter RID of the inner cylindrical wall 120, and an inner diameter defining an outlet channel 168 of the outlet conduit 160. The bottom surface 172 of the lid 170 is in contact with one or more of the outer cylindrical wall 110, the inner cylindrical wall 120 or the outlet conduit 160 to enclose the inlet channel 130 and the precursor cavity 102, with the precursor cavity 102 being defined by the inner surface 122 of the inner cylindrical wall 120.

The 102 is enclosed by a filter media 180 in contact with a bottom end 127 of the inner cylindrical wall 120. As best shown in FIG. 1, the bottom end 127 can include a notch for nesting with the filter media 180. In some embodiments, the bottom end 127 further includes an inner sloped flange 128. In some embodiments, the filter media 180 is secured between an outer retention ring 182 and the bottom end 127 of the inner cylindrical wall 120, and the outer retention ring 182 can be fastened to the bottom end 127 of the inner cylindrical wall 120 by a plurality of fasteners. In some embodiments, the outer retention ring 182 can include threads which can thread into corresponding threads located on the bottom end 127 of the inner cylindrical wall 120. In some embodiments, the outer retention ring 182 can be fastened or secured to the bottom end 127 of the inner cylindrical wall 120 by a compression fit or a snap-fit or with the use of a c-clip. In some embodiments, the filter media 180 is secured between an inner retention 184 ring and a bottom surface of the outlet conduit 160.

The filter media 180 in the form of a planar disk and is concentric to the outlet conduit 160. The filter media 180 has a porosity such that vaporized precursor may pass through but liquid or solid precursor may not. In some embodiments, the filter media 180 has a porosity in the range of 0.2 to 2000 microns.

The filter media 180 is in contact with a top surface of each of the plurality of concentric elongate walls 150 defining a gas exchange zone 104. The gas exchange zone 104 is formed between the filter media 180, the plurality of concentric elongate walls 150 and the bottom wall 140, the gas exchange zone 104 forming a torturous path for a gas to flow from the inlet channel 130 to the outlet conduit 160. Solid precursor rests above the filter media 180, such that depletion of solid precursor does not cause concentration variations within the gas exchange zone 104.

Above the top surface of the filter media 180, low vapor pressure material (referred to as a "precursor" or "precursor material") is within the precursor cavity 102, residing above the filter media 180. Space above the material within the precursor cavity 102 is a dead space of the ampoule 100. As the material epletes, the volume of the dead space increases without affecting the concentration of the saturated or partially saturated carrier gas within the gas exchange zone 104 due to the volume of the gas exchange zone 104 remaining constant. The material can be a precursor for use with a semiconductor manufacturing process. In one or more embodiments, the material with a low vapor pressure is a solid.

As the ampoule 100 is heated, the precursor vaporizes creating a saturated vaporized precursor within the precursor cavity 102. As explained in further detail below, as carrier gas passes across the filter media 180 within the gas exchange zone 104, it mixes with vaporized precursor material which has passed through the filter media 180. Heating the ampoule 100 causes the material in intimate or proximate contact with the filter media 180 to sublime and diffuse across and through the filter media 180. The sublimed material saturates the carrier gas after passing through the filter media 180. In some embodiments, the dead space above the precursor material can contain sublimed material in vapor form.

Because the material is fed through the filter media 180 in a bottom fed configuration, depletion of material does not cause concentration variations within the gas exchange zone 104.

The inlet opening 176 is generally configured to allow a connection to a gas source by way of suitable piping and valve(s) and may have suitable threaded or sealing connections. In one or more embodiments, the gas source is a carrier gas; in one or more embodiments, the carrier gas is inert, such as $N_2$, Ar or He; in one or more embodiments, the carrier gas is not inert, such as $H_2$, provided the carrier gas doesn't react with precursor in vessel. The outlet opening 178 is generally configured to be able to connect to a line, including suitable piping and valve(s), to allow the flow of gases, which may include entrained particles, exiting the ampoule 100 to flow to a processing chamber (or other component). The inlet opening 176 and the outlet opening 178 may have a welded or threaded connection to allow a gas line to be connected. While the embodiments depict one of each an inlet and an outlet port, should a particular application require, multiple inlet ports and outlet ports may be present.

The plurality of concentric elongate walls 150 each comprise a plurality of openings 152 forming a torturous flow path signified by the arrows in the figures. The plurality of concentric elongate walls 150 and the plurality of openings 152 together form a maze-like or "zig-zag" torturous flow path such that not one of the plurality of openings 152 overlaps with another plurality of openings. By way of example, gas enters from a plurality of openings 152 of an outermost elongate wall 150a and exits from an plurality of openings 152 to an innermost elongate wall 150b. Stated differently, the plurality of openings 152 of any of the elongate walls 150 is offset from an adjacent elongate wall 150. In some embodiments, each of the plurality of concentric elongate walls 150 only comprises one opening 152 as shown in FIG. 4.

In the figures, a flow path is generally indicated by a series of dashed arrows showing the gas source "G" starting from the inlet opening 176 and exiting through the outlet opening 178. In some embodiments, as best shown in FIGS. 1-2, the inlet opening 176 and outlet opening 178 are integral to the lid 170. A flow path is defined as gas first entering from the inlet opening 176 and being flown around the inlet channel 130. As the gas reaches the bottom wall 140, the gas enters an outermost opening 152 of the outermost elongate wall 150a. Upon entry into the outermost opening 152, the gas proceeds through the gas exchange zone 104 and torturous path formed by the plurality of concentric elongate walls 150 until the gas exists the torturous path by exiting through an innermost opening 152 of the innermost elongate wall 150b. Vaporized precursor filters through the filter media 180 to mix with the carrier gas as the carrier gas passes through the gas exchange zone 104. The mixed gasses exit through the outlet conduit 160 and through the outlet opening 178.

In some embodiments, a fine filter media is positioned within the outlet opening 178 such that fine particles and/or droplets of precursor do not exit the ampoule. In some embodiments, the fine filter media may be any suitable material or configuration or dimensions or media grade offering one or more of the following characteristics: withstands long-term exposure to the precursor, does not introduce a pressure drop that would impede effective delivery of the precursor, pore size to inhibit and/or prevent fine particles and/or droplets of precursor from exiting the ampoule to protect outlet equipment, and pliable to be capable of making a slight seal with the cylindrical shaft. A non-limiting, exemplary porosity of the fine filter media may be greater than or equal to 0.1 micrometers to less than 100 micrometers, and all values and subranges therebetween, as measured by average pore size.

In some embodiments, the ampoule 100 further comprises one or more external heating elements positioned around the ampoule 100. In some embodiments, an internal heating element is positioned and in contact with the bottom wall 140. In some embodiments, a cable heater is positioned and in contact with the bottom wall 140 such that gases flowing within the gas exchange zone 104 are heated, promoting both sublimation of the precursor material and saturation of the carrier gas. The one or more external heating elements are configured to vaporize the material within the precursor cavity 102 and the internal heating element is configured to heat the elongate walls 150 to promote sublimation of the vapor precursor and carrier gas G throughout the gas exchange zone 104.

In some embodiments, each of the aforementioned structures which come into contact with one another further comprise circular channels for the placement of O-rings or other sealants. In particular, in some embodiments, one or more O-rings is positioned between the filter media 180 and outer retention ring 182, inner retention ring 184, and inner cylindrical wall 120.

In some embodiments, the ampoule 100 is stored and transported up-side-down such that the material rests on the bottom surface 172 of the lid 170. In such a configuration, damage to the filter media 180 is prevented, and migration of the material through the filter media 180 is prevented.

In some embodiments, components are connected using removable bolts through appropriately shaped openings, which may have a threaded portion to allow for easy connection of a threaded bolt. The bolts can be removed to allow disassembly.

According to one or more embodiments, the plurality of openings of any embodiment are suitable to allow carrier gas to flow from one flow channel to another. The plurality of openings may take any suitable shape and/or configuration and/or location along the elongate walls to accommodate flow of entrained and/or saturated carrier gas. Features of the plurality of openings could be a plurality of holes, tapered slots, or other shapes. In one or more embodiments, the plurality of openings are sized and shaped to provide a varying conductance of carrier gas along a longitudinal distance of the container. In one or more embodiments, the plurality of openings opening(s) increase in size in order to increase conductance from the lid toward the bottom wall of the ampoule.

In one or more embodiments, the plurality of openings are notches located at a top end of the elongate walls near the lid. In one or more embodiments, each of the plurality of openings spans a longitudinal distance of greater than or equal to 1-5% to less than or equal to 100% of a length of the wall, including all values and subranges therebetween.

The degree of saturation of conventional ampoules decreases as the solid precursor is consumed due to an increase in volume of the precursor cavity. However, in the embodiments described, because sublimation occurs in the sublimation cavity, which is separated by filter media, the decrease of solid precursor does not affect the degree of saturation, as the volume of the sublimation cavity remains constant. Furthermore, in conventional ampoules, as the precursor is consumed, the gas flow is adjusted during processing to maintain sufficient ratios. However, in the embodiments described the gas flow can remain constant due to the constant volume of the sublimation cavity.

It is understood that the presence of inlet ports, outlet ports and channels/conduits is not limiting and that the number of ports, channels and conduits may be chosen based on space constraints and/or precursor characteristics and/or design need.

In some embodiments, the gas flow across the filter media and through the torturous path is sufficient to entrain and/or vaporize and/or sublime the precursor without a need for bubbling.

Thermocouples, mass flow meters, and pressure gauges may be included in the equipment denoted herein in order to monitor process conditions. In one or more embodiments, a mass flow meter is provided to monitor gas flow into the inlet port. In one or more embodiments, a thermocouple is installed in the bottom wall of the container and at any of the previously disclosed heater locations. In one or more embodiments, a pressure gauge is provided on the inlet line and/or the outlet line. A pressure range within the ampoule in accordance with some embodiments is greater than or equal to 25 torr to less than or equal to 150 torr.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. An ampoule for a semiconductor precursor material, the ampoule comprising:
an outer cylindrical wall with an inside surface and an outside surface;
an inner cylindrical wall with an inside surface and an outside surface, the outside surface of the inner cylindrical wall concentric to the inside surface of the outer cylindrical wall, the inner cylindrical wall having an outer diameter less than an inner diameter of the outer cylindrical wall to form an inlet channel between the inner cylindrical wall and the outer cylindrical wall;
a bottom wall having a top surface with a plurality of concentric elongate walls, each wall having a top surface, each wall comprising an opening offset from the opening in adjacent walls;
a filter media in contact with the top surface of each of the concentric elongate walls;
an outlet conduit having an inside surface and an outside surface, the outlet conduit having an outer diameter less than the inner diameter of the inner cylindrical wall to form a cavity and an inner diameter defining an outlet channel; and
a lid having a bottom surface in contact with one or more of the outer cylindrical wall, the inner cylindrical wall or the outlet conduit to enclose the inlet channel and the cavity, the lid having an inlet opening in fluid communication with the inlet channel and an outlet opening in fluid communication with the outlet conduit.

2. The ampoule of claim 1, wherein a gas exchange zone is formed between the filter media, the plurality of concentric elongate walls and the bottom wall, the exchange zone forming a torturous path for a gas to flow from the inlet channel to the outlet conduit.

3. The ampoule of claim 2, wherein a solid precursor rests above the filter media, such that depletion of solid precursor does not cause concentration variations within the gas exchange zone.

4. The ampoule of claim 1, wherein the filter media is secured between an outer retention ring and a bottom surface of the inner cylindrical wall.

5. The ampoule of claim 4, wherein the outer retention ring is fastened to the bottom surface of the inner cylindrical wall by a plurality of fasteners.

6. The ampoule of claim 1, wherein the filter media is secured between an inner retention ring and a bottom surface of the outlet conduit.

7. The ampoule of claim 1, wherein a bottom end of the inner cylindrical wall includes an inner sloped flange.

8. The ampoule of claim 1, wherein the outer cylindrical wall is integral with the bottom wall.

9. The ampoule of claim 1, wherein the outer cylindrical wall is removably secured to the bottom wall by a plurality of fasteners.

10. The ampoule of claim 9, wherein the top surface of the bottom wall comprises a channel with an O-ring to form a fluid tight seal between the top surface of the bottom wall a the bottom surface of the outer cylindrical wall.

11. The ampoule of claim 1, wherein the outlet conduit is integral with a bottom surface of the lid.

12. The ampoule of claim 1, wherein the inner cylindrical wall is integral with the bottom surface of the lid.

13. The ampoule of claim 1, further comprising a top wall integral with a top surface of the inner cylindrical wall, the top wall having a top surface in contact with the bottom surface of the lid.

14. The ampoule of claim 1, wherein a top surface of the outer cylindrical wall includes a groove having an O-ring.

15. The ampoule of claim 1, wherein a flange extends outward from a top surface of the outer cylindrical wall, the flange in contact with the bottom surface of the lid.

16. The ampoule of claim 1, wherein each of the openings in the concentric elongate walls are offset by 180° from openings in adjacent concentric elongate walls.

* * * * *